(12) United States Patent
Roth et al.

(10) Patent No.: US 12,394,565 B2
(45) Date of Patent: Aug. 19, 2025

(54) FABRICATION OF AN INTEGRATED TRANSFORMER

(71) Applicant: Taiwan Semiconductor Manufacturing Co., Ltd., Hsinchu (TW)

(72) Inventors: Alan Roth, Leander, TX (US); Eric Soenen, Austin, TX (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 85 days.

(21) Appl. No.: 17/648,091

(22) Filed: Jan. 14, 2022

(65) Prior Publication Data

US 2022/0139607 A1 May 5, 2022

Related U.S. Application Data

(60) Continuation of application No. 16/023,703, filed on Jun. 29, 2018, now Pat. No. 11,227,713, which is a
(Continued)

(51) Int. Cl.
*H01F 41/04* (2006.01)
*G05F 1/656* (2006.01)
(Continued)

(52) U.S. Cl.
CPC ........... *H01F 41/041* (2013.01); *G05F 1/656* (2013.01); *H01F 27/24* (2013.01);
(Continued)

(58) Field of Classification Search
CPC ...... H01F 41/046; H01F 41/041; H01F 41/08; H01F 27/2804; H01F 17/0006;
(Continued)

(56) References Cited

U.S. PATENT DOCUMENTS

| 4,210,858 A | 7/1980 | Ford et al. |
| 5,095,357 A * | 3/1992 | Andoh ................ H01F 17/0006 336/200 |

(Continued)

FOREIGN PATENT DOCUMENTS

| CN | 1541396 A | 10/2004 |
| CN | 101277064 A | 10/2008 |

(Continued)

OTHER PUBLICATIONS

Waffenschmidt et al, "Planar resonant multi-output transformer for printed circuit board integration," 2008 IEEE Power Electronics Specialists Conference, Rhodes, Greece, 2008, pp. 4222-4228. (Year: 2008).*

(Continued)

*Primary Examiner* — A. Dexter Tugbang
(74) *Attorney, Agent, or Firm* — Sterne, Kessler, Goldstein & Fox P.L.L.C.

(57) ABSTRACT

A method for forming an integrated transformer is disclosed. The integrated transformer includes a magnetic core situated in a first layer from among multiple layers of a semiconductor layer stack and a first conductor and a second conductor from among multiple conductors. The first conductor is situated within a second layer, above the first layer, from among the multiple layers of the semiconductor layer stack. The second conductor is situated within a third layer, below the first layer, from among the multiple layers of the semiconductor layer stack. The first conductor and the second conductor form a primary winding of the integrated transformer. The integrated transformer additionally includes a secondary winding, wrapped around the magnetic core, situated in the first layer, the second layer, and the third layer.

20 Claims, 7 Drawing Sheets

Related U.S. Application Data division of application No. 15/067,784, filed on Mar. 11, 2016, now Pat. No. 10,636,560.

(51) Int. Cl.
*H01F 27/24* (2006.01)
*H01F 27/28* (2006.01)
*H01F 41/08* (2006.01)
*H01F 17/00* (2006.01)
*H10D 1/20* (2025.01)

(52) U.S. Cl.
CPC ..... *H01F 27/2804* (2013.01); *H01F 27/2823* (2013.01); *H01F 41/046* (2013.01); *H01F 41/08* (2013.01); *H01F 17/0006* (2013.01); *H10D 1/20* (2025.01); *Y10T 29/4902* (2015.01); *Y10T 29/49071* (2015.01)

(58) Field of Classification Search
CPC ..... H01F 27/24; H01F 27/2823; H01L 28/10; G05F 1/656; Y10T 29/4902; Y10T 29/49071; H10D 1/20
See application file for complete search history.

(56) References Cited

U.S. PATENT DOCUMENTS

| | | |
|---|---|---|
| 5,349,743 A | 9/1994 | Grader et al. |
| 5,831,331 A | 11/1998 | Lee |
| 6,281,778 B1 | 8/2001 | El-Sharawy et al. |
| 6,441,715 B1 * | 8/2002 | Johnson ............ H01F 17/0006 336/200 |
| 6,480,086 B1 | 11/2002 | Kluge et al. |
| 6,870,456 B2 | 3/2005 | Gardner |
| 8,049,301 B2 | 11/2011 | Hui |
| 8,072,042 B1 | 12/2011 | Kroener |
| 8,102,236 B1 | 1/2012 | Fontana, Jr. et al. |
| 8,130,067 B2 * | 3/2012 | Lee ...................... H01F 41/046 336/200 |
| 8,598,854 B2 | 12/2013 | Soenen et al. |
| 8,629,694 B1 | 1/2014 | Wang et al. |
| 8,629,706 B2 | 1/2014 | Chen et al. |
| 8,742,539 B2 * | 6/2014 | Weyers ................ H01L 28/02 257/E21.022 |
| 8,816,670 B2 | 8/2014 | Lee et al. |
| 8,957,647 B2 | 2/2015 | Yang |
| 9,069,370 B2 | 6/2015 | Soenen et al. |
| 2004/0135662 A1 | 7/2004 | Harding |
| 2007/0139976 A1 | 6/2007 | deRochemont |
| 2007/0234554 A1 | 10/2007 | Hung et al. |
| 2008/0007382 A1 | 1/2008 | Snyder |
| 2011/0279214 A1 | 11/2011 | Lee et al. |
| 2012/0176186 A1 | 7/2012 | Chen et al. |
| 2012/0299563 A1 | 11/2012 | Wu et al. |
| 2013/0241510 A1 | 9/2013 | Shi et al. |
| 2013/0307516 A1 | 11/2013 | Horng et al. |
| 2013/0320944 A1 | 12/2013 | Siao |
| 2014/0110822 A1 | 4/2014 | Weyers et al. |
| 2014/0266114 A1 | 9/2014 | Chern et al. |
| 2014/0347025 A1 | 11/2014 | Liao |
| 2015/0234403 A1 | 8/2015 | Siao et al. |
| 2015/0357918 A1 | 12/2015 | Roth et al. |
| 2016/0358705 A1 | 12/2016 | Lin et al. |
| 2017/0263371 A1 | 9/2017 | Roth et al. |
| 2018/0302986 A1 | 10/2018 | Sturcken et al. |
| 2018/0308618 A1 | 10/2018 | Roth et al. |

FOREIGN PATENT DOCUMENTS

| | | |
|---|---|---|
| CN | 102479685 A | 5/2012 |
| CN | 102801307 A | 11/2012 |
| CN | 103403816 A | 11/2013 |
| CN | 204045361 U | 12/2014 |
| JP | 2010080594 A * | 4/2010 |
| JP | 2013042102 A | 2/2013 |
| NL | 9300306 A | 9/1994 |

OTHER PUBLICATIONS

English language abstract of CN 101277064 A, Espacenet: https://worldwide.espacenet.com/publicationDetails/biblio?DB=EPODOC&II=0&ND=3&adjacent=true&locale=en_EP&FT=D&date=20081001&CC=CN&NR=101277064A&KC=A# ; accessed Feb. 27, 2017, listed as document FP1 on the accompanying form PTO/SB/08A.
Taiwanese Office Action directed to related Taiwanese Application No. 10620043000, mailed Jan. 12, 2017; 6 pages.

* cited by examiner

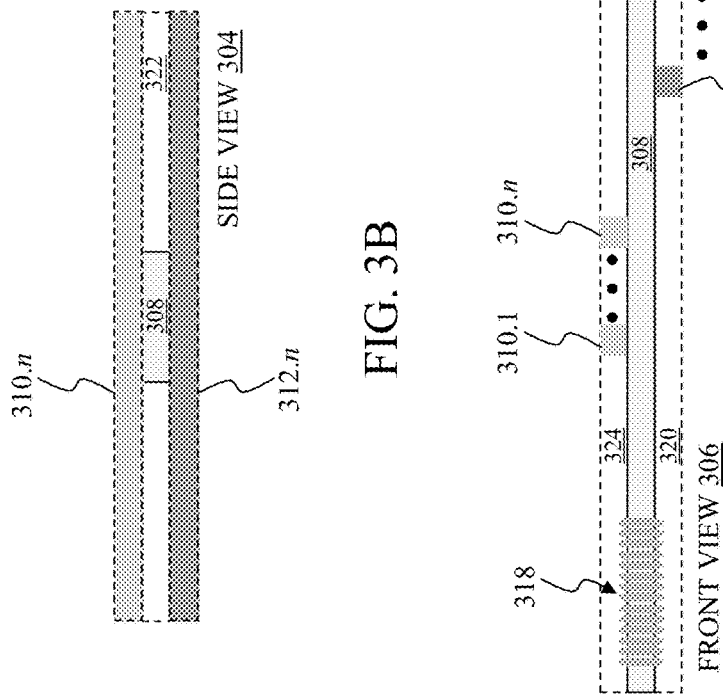
FIG. 3B
FIG. 3C
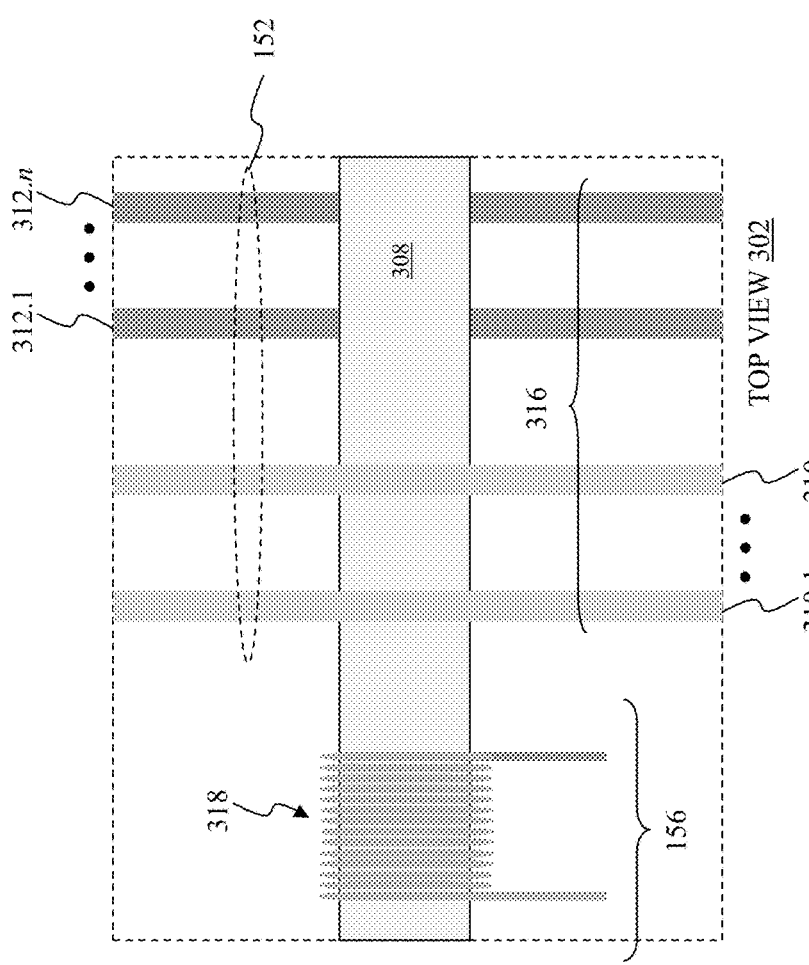
FIG. 3A

FABRICATION OF AN INTEGRATED TRANSFORMER

CROSS-REFERENCE TO RELATED APPLICATIONS

The present application is a continuation of U.S. Non-provisional patent application Ser. No. 16/023,703, filed on Jun. 29, 2018, now U.S. Pat. No. 11,227,713, which is a divisional of U.S. patent application Ser. No. 15/067,784, filed Mar. 11, 2016, now U.S. Pat. No. 10,636,560, all of which are incorporated herein by reference in their entireties.

BACKGROUND

Electronic devices provide power to their components using a centralized power source, such as a battery to provide an example. Often times, voltage provided by this centralized power source fluctuates as demand for the power changes. The electronic devices include one or more voltage regulator circuits to ensure a constant, or substantially constant, voltage is being provided to their components. Additionally, the components of the electronic devices can operate at different voltages. The one or more voltage regulator circuits can be used to provide these different voltages to the components of the electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A through FIG. 3C illustrate a second exemplary inductive sensing circuit that can be implemented within the exemplary voltage regulator circuit of FIG. 1A according to an exemplary embodiment of the present disclosure;

DETAILED DESCRIPTION

Figure 1A:
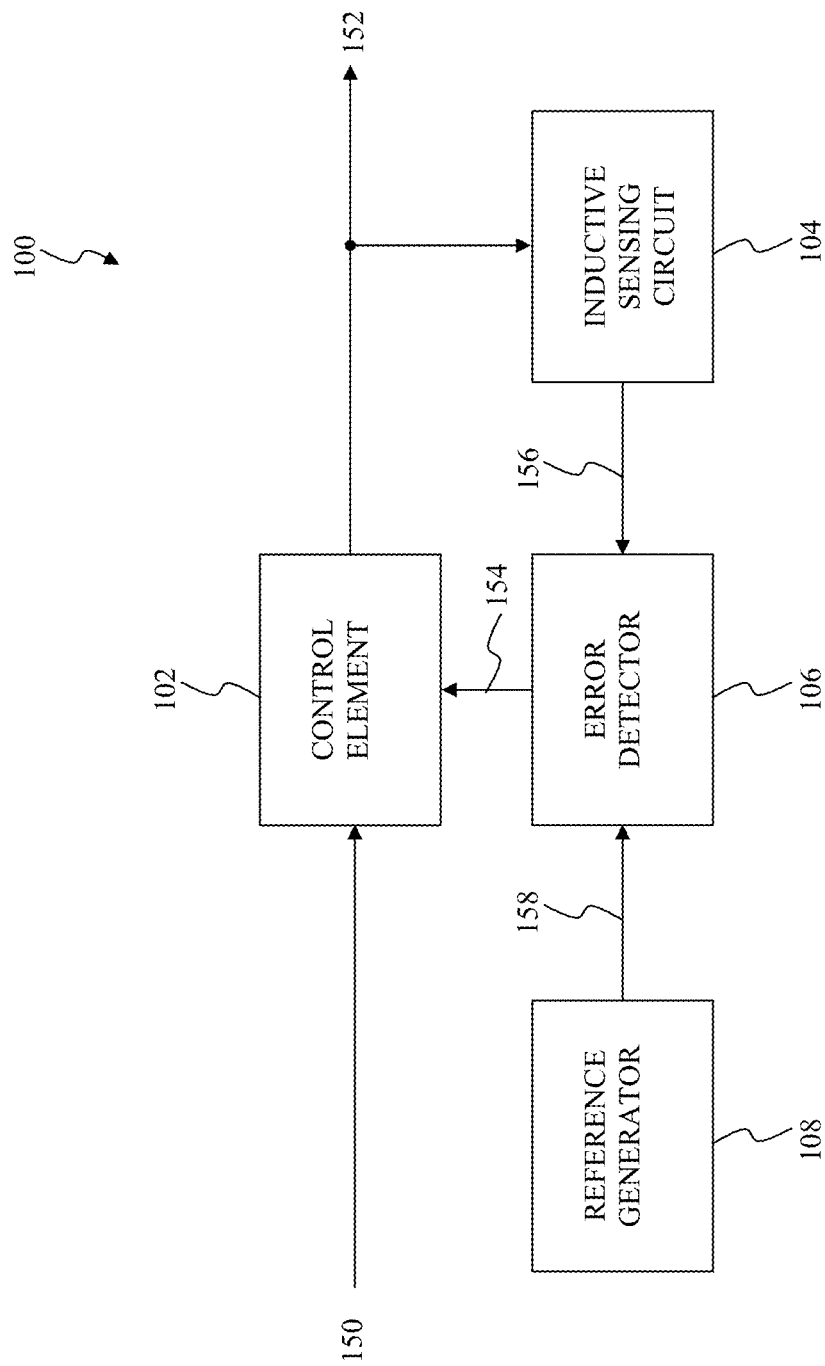
FIG. 1A illustrates a block diagram of an exemplary voltage regulator circuit according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Overview

The inductive sensing circuits of the present disclosure include multiple conductors that carry one or more time-varying currents. The one or more time-varying currents generate a magnetic field as they flow through the multiple conductors. The inductive sensing circuits sense a voltage which is induced by the magnetic field. The multiple conductors can be configured and arranged as one or more primary windings and one or more secondary windings of an integrated transformer. The one or more primary windings and the one or more secondary windings are configured and arranged such that a change in the one or more time-varying currents flowing through the one or more primary windings induces a voltage across the one or more secondary windings through electromagnetic induction. The one or more primary windings and the one or more secondary windings can be situated around a magnetic core that is situated within the one or more conductive layers and/or the one or more non-conductive layers to form the integrated transformer. Alternatively, some of the multiple conductors can be configured and arranged to form a spiral inductor within the one or more conductive layers and/or the one or more non-conductive layers to form an integrated inductor. The spiral inductor can optionally use a magnetic core that is situated within the one or more conductive layers and/or the one or more non-conductive layers.

Exemplary Voltage Regulator Circuit

FIG. 1A illustrates a block diagram of an exemplary voltage regulator circuit according to an exemplary embodiment of the present disclosure. A voltage regulator circuit 100 adjusts an input voltage 150 to maintain a constant, or substantially constant, output voltage 152. The voltage regulator circuit 100 includes a control element 102, an inductive sensing circuit 104, an error detector 106, and a reference generator 108. In an exemplary embodiment, the voltage regulator circuit 100 is disposed onto a semiconductor substrate. The semiconductor substrate can be a thin slice of semiconductor material, such as a silicon crystal, but can include other materials, or combinations of materials, such as sapphire or any other suitable material that will be apparent to those skilled in the relevant art(s) without departing from the spirit and scope of the present disclosure. In this exemplary embodiment, the semiconductor substrate includes one or more active regions for forming one or more active components of the control element 102, the inductive sensing circuit 104, the error detector 106, and/or the reference generator 108. Additionally, in this exemplary embodiment, one or more interconnections between the control element 102, the inductive sensing circuit 104, the error detector 106, and/or the reference generator 108 and/or one or more passive components of the control element 102, the inductive sensing circuit 104, the error detector 106, and/or the reference generator 108 can be formed using one or more conductive layers. The one or more conductive layers are interdigitated with one or more non-conductive layers. The one or more conductive layers include one or more conductive materials such as tungsten (W), aluminum (Al), copper (Cu), gold (Au), silver (Ag), or platinum (Pt) to provide some examples. The one or more non-conductive layers include one or more non-conductive materials such as silicon dioxide ($SiO_2$) or nitride ($N^{3-}$) to provide some examples.

The control element 102 adjusts the input voltage 150 in accordance with an error signal 154 to maintain the constant, or substantially constant, output voltage 152. In an exemplary embodiment, the control element 102 operates in a similar manner as a variable resistance that continuously adjusts a voltage divider network to maintain the output voltage 152 to form a linear regulator, such as a shunt regulator or a series regulator to provide some examples. The control element 102 can provide a path from the input voltage 150 to ground through the variable resistance to operate as the shunt regulator or can provide a path from the input voltage 150 to a load through the variable resistance to operate as the series regulator. In another exemplary embodiment, the control element 102 includes one or more active devices that continually switch between on and off states to maintain an average value for the output voltage 152 to form a switching regulator.

The inductive sensing circuit 104 monitors the output voltage 152 to provide a sensed output voltage 156. The inductive sensing circuit 104 includes one or more integrated inductive sensing elements situated within the one or more conductive layers and/or the one or more non-conductive layers to sense the output voltage 152 to provide the sensed output voltage 156. In an exemplary embodiment, the inductive sensing element includes one or more primary windings and one or more secondary windings. The one or more primary windings and the one or more secondary windings are configured and arranged such that a change in current flowing through the one or more primary windings induces a voltage across the one or more secondary windings through electromagnetic induction. In this exemplary embodiment, the one or more primary windings and the one or more secondary windings are situated around a magnetic core that is situated within the one or more conductive layers and/or the one or more non-conductive layers to form an integrated transformer for sensing the output voltage 152. In this exemplary embodiment, the magnetic core can be configured and arranged as one or more straight cylindrical rods, one or more "I" cores, one or more "C" or "U" cores, one or more "E" cores, one or more rings or beads, one or more planar cores, or any combination thereof. The magnetic core can be implemented using one or more solid metals, such as hard or soft iron, silicon steel, mu-metal, permalloy, and supermalloy to provide some examples, one or more powdered metals, such as carbonyl iron or iron powder to provide some examples, one or more ceramics, such as ferrite to provide an example, or any combination thereof. In another exemplary embodiment, the one or more integrated inductive sensing elements can include a spiral inductor within the one or more conductive layers and/or the one or more non-conductive layers to form an integrated inductor for sensing the output voltage 152. The spiral inductor can optionally use a magnetic core that is situated within the one or more conductive layers and/or the one or more non-conductive layers.

The error detector 106 compares the sensed output voltage 156 and a reference voltage 158 to provide the error signal 154. The error signal 154 can represent an analog error signal that is used to adjust the voltage divider network to maintain the output voltage 152 or a digital error signal that is used to switch between the on and off states to maintain the average value for the output voltage 152 to provide some examples. When the error signal 154 is at a first value, such as greater than zero to provide an example, the reference voltage 158 is greater than the sensed output voltage 156. In this situation, the control element 102 increases the output voltage 152 in response to the error signal 154 to decrease the error signal 154. Otherwise, when the error signal 154 is at a second value, such as less than zero to provide an example, the reference voltage 158 is less than the sensed output voltage 156. In this situation, the control element 102 decreases the output voltage 152 in response to the error signal 154 to decrease the error signal 154.

The reference generator 108 provides the reference voltage 158. The reference generator 108 can be implemented using any suitable circuitry that produces a constant, or substantially constant, voltage irrespective of loading, power supply variations, and/or temperature changes that will be apparent to those of ordinary skill in the relevant art(s) without departing from the spirit and scope of the present disclosure. For example, the reference generator 108 can be implemented as a bandgap voltage based reference or a Zener diode based reference.

Figure 1B:
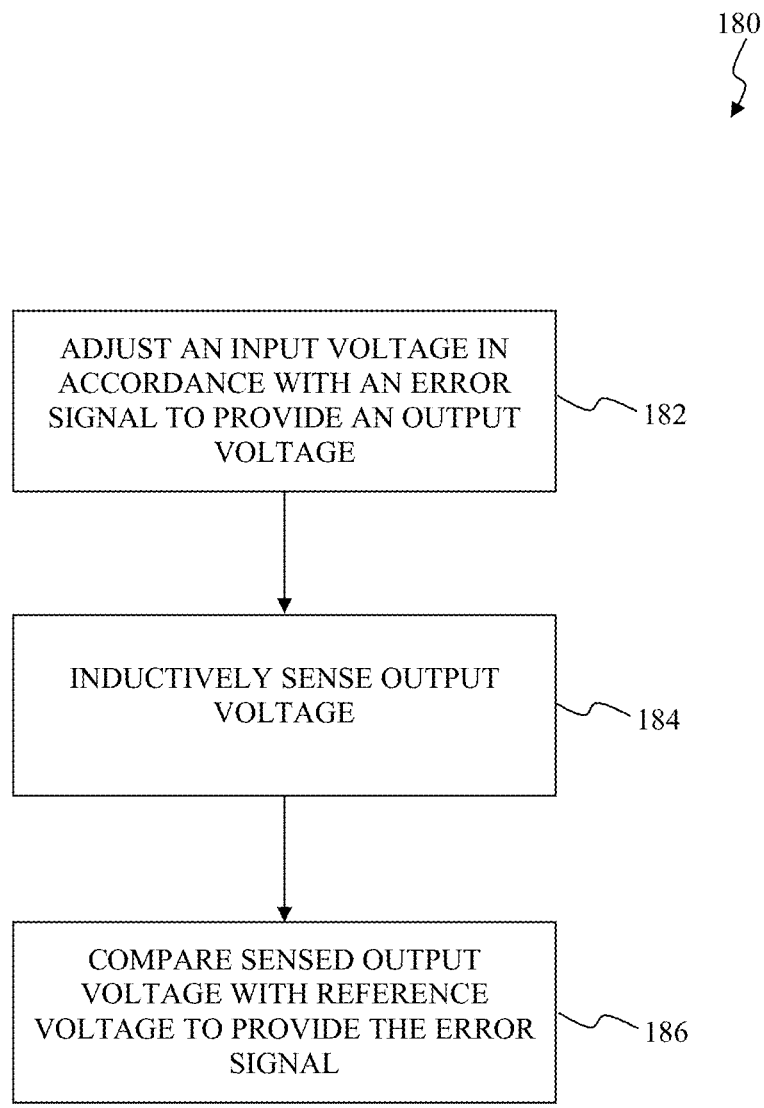
FIG. 1B is a flowchart of exemplary operational steps of the exemplary voltage regulator circuit of FIG. 1A according to an exemplary embodiment of the present disclosure.

FIG. 1B is a flowchart of exemplary operational steps of the exemplary voltage regulator circuit of FIG. 1A according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 180 of a voltage regulator circuit, such as the voltage regulator circuit 100 to provide an example.

At step 182, the operational control flow 180 adjusts an input voltage, such as the input voltage 150 to provide an example, in accordance with an error signal, such as the error signal 154 to provide an example, to provide an output voltage, such as the output voltage 152 to provide an example. In an exemplary embodiment, the operational control flow 180 operates in a similar manner as a variable resistance that continuously adjusts a voltage divider network to maintain the output voltage to form a linear regulator, such as a shunt regulator or a series regulator to provide some examples. The operational control flow 180 can provide a path from the input voltage 150 to ground through the variable resistance to operate as the shunt regulator or can provide a path from the input voltage to a load through the variable resistance to operate as the series regulator. In another exemplary embodiment, the operational control flow 180 includes one or more active devices that continually switch between on and off states to maintain an average value for the output voltage to form a switching regulator.

At step 184, the operational control flow 180 inductively senses the output voltage of step 182. The operational control flow 180 uses an inductive sensing circuit, such as the inductive sensing circuit 104 to provide an example, to monitor the output voltage of step 182. The inductive sensing circuit includes one or more integrated inductive sensing elements situated within the one or more conductive layers and/or the one or more non-conductive layers to sense the output voltage of step 182. In an exemplary embodiment, the inductive sensing element includes one or more primary windings and one or more secondary windings. The one or more primary windings and the one or more secondary windings are configured and arranged such that a change in current flowing through the one or more primary windings induces a voltage across the one or more secondary windings through electromagnetic induction. In this exemplary embodiment, the one or more primary windings and the one or more secondary windings are situated around a magnetic core that is situated within the one or more conductive layers and/or the one or more non-conductive layers to form an integrated transformer for sensing the output voltage of step 182. In this exemplary embodiment, the magnetic core can be configured and arranged as one or more straight cylindrical rods, one or more "I" cores, one or more "C" or "U" cores, one or more "E" cores, one or more rings or beads, one or more planar cores, or any combination thereof. The magnetic core can be implemented using one or more solid metals, such as hard or soft iron, silicon steel, mu-metal, permalloy, and supermalloy to provide some examples, one or more powdered metals, such as carbonyl iron or iron powder to provide some examples, one or more ceramics, such as ferrite to provide an example, or any combination thereof. In another exemplary embodiment, the one or more integrated inductive sensing elements can include a spiral inductor within the one or more conductive layers and/or the one or more non-conductive layers to form an integrated inductor for sensing the output voltage of step 182. The spiral inductor can optionally use a magnetic core that is situated within the one or more conductive layers and/or the one or more non-conductive layers.

At step 186, the operational control flow 180 compares the sensed output voltage of step 184 with a reference voltage, such as the reference voltage 158 to provide an example, to provide the error signal of step 182. The operational control flow 180 compares the sensed output voltage of step 184 and the reference voltage to provide the error signal of step 182. The error signal of step 182 can represent an analog error signal that is used to adjust the voltage divider network to maintain the output voltage of step 182 or a digital error signal that is used to switch between the on and off states to maintain the average value for the output voltage of step 182 to provide some examples. When the error signal of step 182 is at a first value, such as greater than zero to provide an example, the reference voltage is greater than the sensed output voltage of step 184. In this situation, the operational control flow 180 increases the output voltage of step 182 in response to the error signal of step 182 to decrease the error signal of step 182. Otherwise, when the error signal of step 182 is at a second value, such as less than zero to provide an example, the reference voltage is less than the sensed output voltage of step 184. In this situation, the operational control flow 180 decreases the output voltage of step 182 in response to the error signal of step 182 to decrease the error signal of step 182.

First Exemplary Inductive Sensing Circuit

Figure 2B:
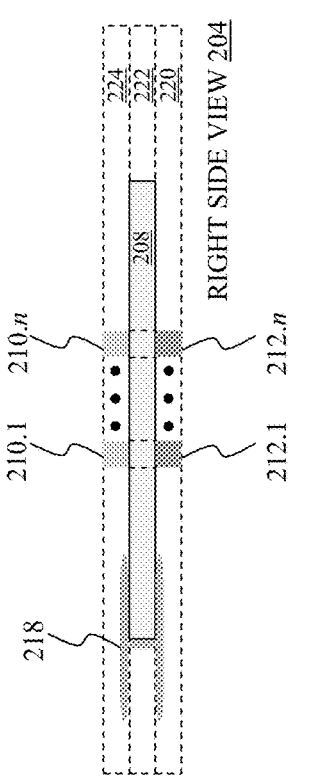
FIG. 2A through FIG. 2C illustrate a first exemplary inductive sensing circuit that can be implemented within the exemplary voltage regulator circuit of FIG. 1A according to an exemplary embodiment of the present disclosure.
Figure 2C:
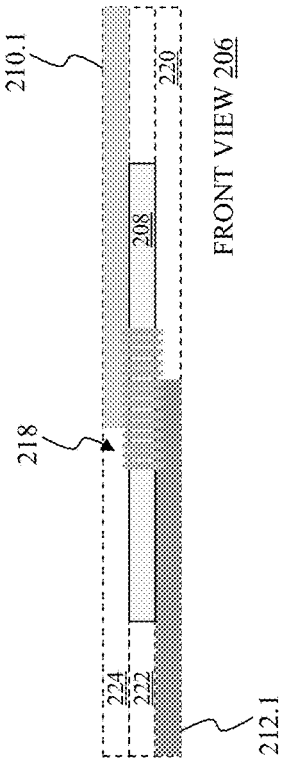
Figure 2A:
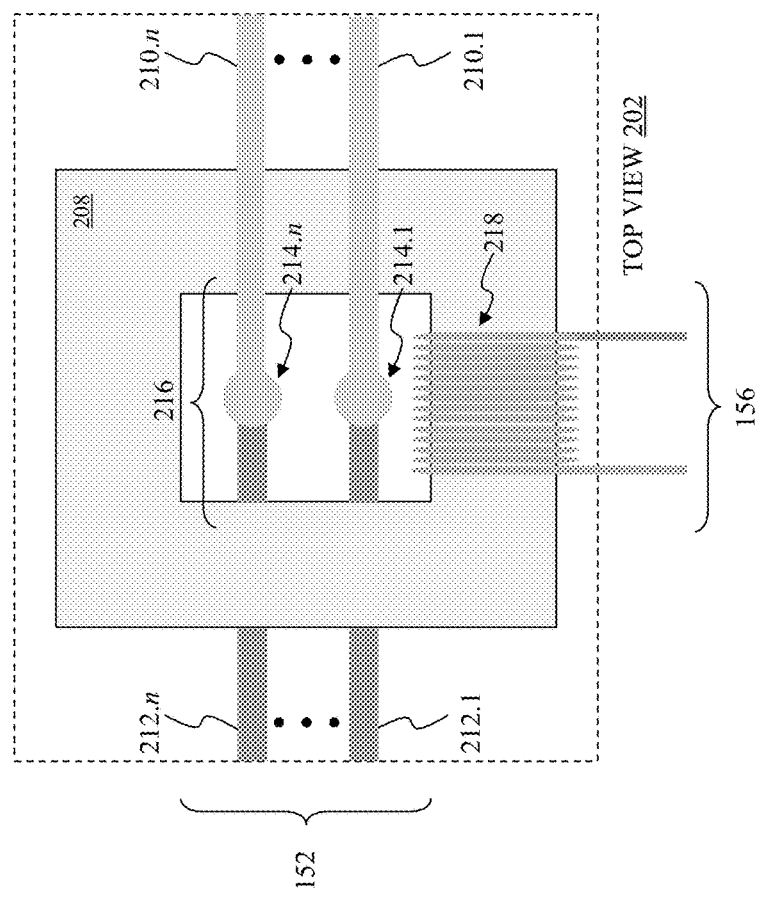

FIG. 2A through FIG. 2C illustrate a first exemplary inductive sensing circuit that can be implemented within the exemplary voltage regulator circuit of FIG. 1A according to an exemplary embodiment of the present disclosure. FIG. 2A through FIG. 2C illustrate a top view 202, a right side view 204, and a front view 206, respectively, of an inductive sensing circuit. The inductive sensing circuit can represent an exemplary embodiment of the inductive sensing circuit 104. As such, the inductive sensing circuit monitors the output voltage 152 to provide the sensed output voltage 156.

The inductive sensing circuit includes a magnetic core 208. As illustrated in FIG. 2A, the magnetic core 208 is implemented using two "C" or "U" cores. However, those of ordinary skill in the relevant art(s) will recognize the magnetic core 208 can be implemented using other arrangements such as one or more "I" cores, one or more "E" cores, one or more rings or beads, or any combination thereof without departing from the spirit and scope of the present disclosure. The magnetic core 208 can be implemented using one or more solid metals, such as hard or soft iron, silicon steel, mu-metal, permalloy, and supermalloy to provide some examples, one or more powdered metals, such as carbonyl iron or iron powder to provide some examples, one or more ceramics, such as ferrite to provide an example, or any combination thereof. However, those of ordinary skill in the relevant art(s) will recognize the magnetic core 208 can be implemented using any suitable magnetic or ferromagnetic material without departing from the spirit and scope of the present disclosure.

As additionally illustrated in FIG. 2A through FIG. 2C, one or more top conductors 210.1 through 210.$n$ are situated above the magnetic core 208 and one or more bottom conductors 212.1 through 212.$n$ are situated below the magnetic core 208. The one or more top conductors 210.1 through 210.$n$ are physically and electrically connected to the one or more bottom conductors 212.1 through 212.$n$ using vias 214.1 through 214.$n$. As illustrated in the top view 202 of FIG. 2A, each of the vias 214.1 through 214.$n$ physically and electrically connect a corresponding top conductor from among the one or more top conductors 210.1 through 210.$n$ and a corresponding bottom conductor from among the one or more bottom conductors 212.1 through 212.$n$. In an exemplary embodiment, the vias 214.1 through 214.$n$ are situated in a center, or approximate center, of the magnetic core 208; however, other arrangements for the vias 214.1 through 214.$n$ are possible as will be recognized by those of ordinary skill in the relevant art(s) without departing from the spirit and scope of the present disclosure. As additionally illustrated in the top view 202 of FIG. 2A, the one or more top conductors 210.1 through 210.$n$ and the one or more bottom conductors 212.1 through 212.$n$ carry a time varying current, such as the output voltage 152 of the voltage regulator circuit 100 to provide an example. In an exemplary embodiment, the one or more top conductors 210.1 through 210.$n$ and the one or more bottom conductors 212.1 through 212.$n$ include a single top conductor and a single bottom conductor. However, one or more physical characteristics, such as line width or line thickness to provide some examples, of a single top conductor from among the one or more top conductors 210.1 through 210.$n$ and a single bottom conductor from among the one or more bottom conductors 212.1 through 212.$n$ can prevent the single top conductor and the single bottom conductor from carrying the time varying current. In another exemplary embodiment, the one or more top conductors 210.1 through 210.$n$ and the one or more bottom conductors 212.1 through 212.$n$ include multiple top conductors and multiple bottom conductors to separate the time varying current into multiple time varying currents.

The one or more top conductors 210.1 through 210.$n$ and the one or more bottom conductors 212.1 through 212.$n$ form a primary winding 216 of an integrated transformer that is integrated within a semiconductor substrate. As further illustrated in FIG. 2A through FIG. 2C, an inductive sensing element situated around the magnetic core 208 forms a secondary winding 218 of the integrated transformer. The primary winding 216 and the secondary winding 218 is configured and arranged such that a change in the time varying current flowing through the primary winding 216 induces a voltage, such as sensed output voltage 156 of the voltage regulator circuit 100 to provide an example, across the secondary winding 218 through electromagnetic induction. In general, the induced voltage can be approximated as:

$$V_2 = \frac{N_2}{N_1} V_1. \tag{1}$$

where $V_2$ and $V_1$ represent the induced voltage across the secondary winding 218 and a voltage potential across the primary winding 216, respectively, and $N_1$ and $N_2$ represent numbers of turns of the primary winding 216 and the secondary winding 218, respectively. The numbers of turns of the primary winding 216 and the secondary winding 218 represent the number of times the primary winding 216 and the secondary winding 218, respectively, wrap around the magnetic core 208. In an exemplary embodiment, a ratio of $N_2$ and $N_1$ is greater than one to compensate for hysteresis losses and/or eddy current in the magnetic core 208.

As illustrated in the right side view 204 of FIG. 2B and the front view 206 of FIG. 2C, the one or more bottom conductors 212.1 through 212.n are situated within a first layer 220 of a semiconductor layer stack, the magnetic core 208 is situated within a second layer 222 of the semiconductor layer stack, and the one or more top conductors 210.1 through 210.n are situated within a third layer 224 of the semiconductor layer stack. In an exemplary embodiment, the first layer 220 and the third layer 224 are conductive layers of the semiconductor layer stack and the second layer 222 is a non-conductive layer of the semiconductor layer stack. In another exemplary embodiment, the first layer 220 and the third layer 224 are non-conductive layers of the semiconductor layer stack and the second layer 222 is a conductive layer of the semiconductor layer stack. Although the magnetic core 208 is illustrated as being situated within the second layer 222 of the semiconductor layer stack, those of ordinary skill in the relevant art(s) will recognize the magnetic core 208 can be formed in any combination of conductive layers and non-conductive layers without departing from the spirit and scope of the present disclosure.

Second Exemplary Inductive Sensing Circuit

FIG. 3A through FIG. 3C illustrate a second exemplary inductive sensing circuit that can be implemented within the exemplary voltage regulator circuit of FIG. 1A according to an exemplary embodiment of the present disclosure. FIG. 3A through FIG. 3C illustrate a top view 302, a right side view 304, and a front view 306, respectively of an inductive sensing circuit. The inductive sensing circuit can represent an exemplary embodiment of the inductive sensing circuit 104. As such, the inductive sensing circuit monitors the output voltage 152 to provide the sensed output voltage 156.

The inductive sensing circuit includes a magnetic core 308. As illustrated in FIG. 3A through FIG. 3C, the magnetic core 308 is implemented using one or more planar cores. However, those of ordinary skill in the relevant art(s) will recognize the magnetic core 308 can be implemented using other arrangements as one or more straight cylindrical rods, one or more rings or beads, one or more planar cores, or any combination thereof without departing from the spirit and scope of the present disclosure. The magnetic core 308 can be implemented using one or more solid metals, such as hard or soft iron, silicon steel, mu-metal, permalloy, and supermalloy to provide some examples, one or more powdered metals, such as carbonyl iron or iron powder to provide some examples, one or more ceramics, such as ferrite to provide an example, or any combination thereof. However, those of ordinary skill in the relevant art(s) will recognize the magnetic core 308 can be implemented using any suitable magnetic or ferromagnetic material without departing from the spirit and scope of the present disclosure.

As additionally illustrated in FIG. 3A through FIG. 3C, one or more top conductors 310.1 through 310.n are situated above the magnetic core 308 and one or more bottom conductors 312.1 through 312.n are situated below the magnetic core 308. In an exemplary embodiment, the one or more top conductors 310.1 through 310.n and the one or more bottom conductors 312.1 through 312.n are arranged substantially parallel to each other and substantially orthogonal to the magnetic core. As illustrated in the top view 302 of FIG. 3A, the one or more top conductors 310.1 through 310.n and the one or more bottom conductors 312.1 through 312.n carry time varying currents, such as the output voltage 152 of the voltage regulator circuit 100 to provide an example. The time varying current carried by the one or more top conductors 310.1 through 310.n flows in a direction that is opposite to a direction that the time varying current carried by the one or more bottom conductors 312.1 through 312.n is flowing. As such, the time varying current carried by the one or more top conductors 310.1 through 310.n is approximately 180 degrees out of phase with the time varying current carried by the one or more bottom conductors 312.1 through 312.n. For example, the one or more top conductors 310.1 through 310.n can carry the output voltage 152 to a load attached to the voltage regulator circuit 100 and the one or more bottom conductors 312.1 through 312.n can be configured to provide a return path for the output voltage 152 from the load. In an exemplary embodiment, the one or more top conductors 310.1 through 310.n and the one or more bottom conductors 312.1 through 312.n include a single top conductor and a single bottom conductor. However, one or more physical characteristics, such as line width or line thickness to provide some examples, of a single top conductor from among the one or more top conductors 310.1 through 310.n and a single bottom conductor from among the one or more bottom conductors 312.1 through 312.n can prevent the single top conductor and the single bottom conductor from carrying the time varying currents. In another exemplary embodiment, the one or more top conductors 310.1 through 310.n and the one or more bottom conductors 312.1 through 312.n include multiple top conductors and multiple bottom conductors to separate the time varying currents into multiple time varying currents.

The time varying currents carried one or more top conductors 310.1 through 310.n and the one or more bottom conductors 312.1 through 312.n generate a magnetic field. Because, the time varying current carried by the one or more top conductors 310.1 through 310.n is approximately 180 degrees out of phase with the time varying current carried by the one or more bottom conductors 312.1 through 312.n, both of these time varying currents contribute to the magnetic field. The one or more top conductors 310.1 through 310.n and the one or more bottom conductors 312.1 through 312.n form a primary winding 316 of an integrated transformer that is integrated within a semiconductor substrate. As further illustrated in the top view 302 of FIG. 3A and the front view 306 of FIG. 3C, an inductive sensing element situated around the magnetic core 308 forms a secondary winding 318 of the integrated transformer. The primary winding 316 and the secondary winding 318 are configured and arranged such that a change in the time varying current flowing through the primary winding 316 induces a voltage, such as sensed output voltage 156 of the voltage regulator circuit 100 to provide an example, across the secondary winding 318 through electromagnetic induction.

As illustrated in the right side view 304 of FIG. 3B and the front view 306 of FIG. 3C, the one or more bottom conductors 312.1 through 312.n are situated within a first layer 320 of a semiconductor layer stack, the magnetic core 308 is situated within a second layer 322 of the semiconductor layer stack, and the one or more top conductors 310.1 through 310.n are situated within a third layer 324 of the semiconductor layer stack. In an exemplary embodiment, the first layer 320 and the third layer 324 represent conductive layers of the semiconductor layer stack and the second layer 322 represents a non-conductive layer of the semiconductor layer stack. In another exemplary embodiment, the first layer 320 and the third layer 324 represent non-conductive layers of the semiconductor layer stack and the second layer 322 represents a conductive layer of the semiconductor layer stack. Although the magnetic core 308 is illustrated as being situated within the second layer 322 of the semiconductor layer stack, those of ordinary skill in the relevant art(s) will recognize the magnetic core 308 can be formed in any combination of conductive layers and non-conductive layers without departing from the spirit and scope of the present disclosure.

Exemplary Fabrication of the First Exemplary Inductive Sensing Circuit and the Second Exemplary Inductive Sensing Circuit.

Figure 4:
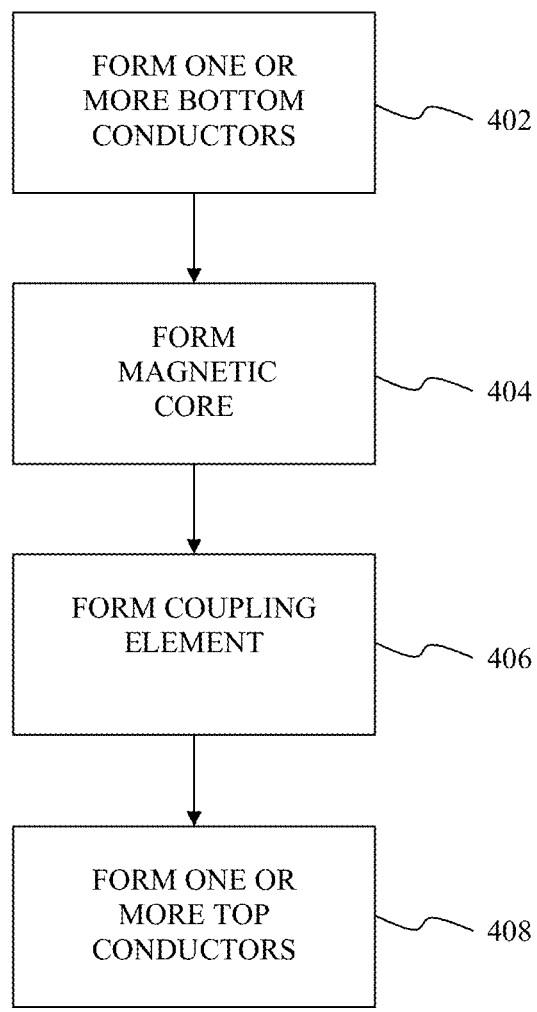
FIG. 4 illustrates an exemplary method of fabrication of the first exemplary inductive sensing circuit of FIG. 2 and the second exemplary inductive sensing circuit of FIG. 3 according to an exemplary embodiment of the present disclosure.

FIG. 4 illustrates an exemplary method of fabrication of the first exemplary inductive sensing circuit of FIG. 2A through FIG. 2C and the second exemplary inductive sensing circuit of FIG. 3A through FIG. 3C according to an exemplary embodiment of the present disclosure. The exemplary method of fabrication represents a multiple-step sequence of photolithographic and chemical processing steps to create an inductive sensing circuit, such as the inductive sensing circuit of FIG. 2A through FIG. 2C or the inductive sensing circuit of FIG. 3A through FIG. 3C to provide some examples. The multiple-step sequence of photolithographic and chemical processing steps can include deposition, removal, and/or patterning to provide some examples. The deposition represents a processing step of the exemplary method of fabrication where material is grown, coated, or otherwise transferred. The removal represents another processing step of the exemplary method of fabrication where material is removed. The patterning represents a further processing step exemplary method of fabrication where material is shaped or altered.

At step 402, the exemplary method of fabrication forms one or more bottom conductors, such as the one or more bottom conductors 212.1 through 212.n or the one or more bottom conductors 312.1 through 312.n to provide some examples, within a first layer of a semiconductor layer stack. In an exemplary embodiment, the first layer of the semiconductor layer stack represents a conductive layer. In this exemplary embodiment, the exemplary method of fabrication performs a deposition process within the conductive layer to deposit one or more conductive materials within the conductive layer. The one or more conductive materials can include tungsten (W), aluminum (Al), copper (Cu), gold (Au), silver (Ag), or platinum (Pt) to provide some examples. The exemplary method of fabrication performs a patterning process on the one or more conductive materials within the conductive layer to shape the one or more conductive materials to form the one or more bottom conductors within the first layer of the semiconductor layer stack. In another exemplary embodiment, the first layer of the semiconductor layer stack represents a non-conductive layer. In this other exemplary embodiment, the exemplary method of fabrication performs a deposition process within the non-conductive layer to grow one or more non-conductive materials. The one or more non-conductive materials can include silicon dioxide ($SiO_2$) or nitride ($N^{3-}$) to provide some examples. Next, the exemplary method of fabrication performs a removal process on the non-conductive layer to remove some of the one or more non-conductive materials to from one or more trenches. Thereafter, the exemplary method of fabrication performs a deposition process within the non-conductive layer to deposit the one or more conductive materials within the one or more trenches to form the one or more bottom conductors within the first layer of the semiconductor layer stack.

At step 404, the exemplary method of fabrication forms a magnetic core, such as the magnetic core 208 or the magnetic core 308 to provide some examples, within a second layer of the semiconductor layer stack. In an exemplary embodiment, the second layer of the semiconductor layer stack represents one or more conductive layers and/or one or more non-conductive layers. For each conductive layer, the exemplary method of fabrication performs a deposition process within the conductive layer to deposit one or more magnetic or ferromagnetic materials, such as solid metals, such as hard or soft iron, silicon steel, mu-metal, permalloy, and supermalloy to provide some examples, one or more powdered metals, such as carbonyl iron or iron powder to provide some examples, one or more ceramics, such as ferrite to provide an example, or any combination thereof within the one or more trenches to form the magnetic core within the second layer of the semiconductor layer stack. The exemplary method of fabrication performs a patterning process on the one or more magnetic or ferromagnetic materials within the conductive layer to shape the one or more magnetic or ferromagnetic materials to form the magnetic core or a portion thereof. For each non-conductive layer, the exemplary method of fabrication performs a deposition process within the non-conductive layer to grow the one or more non-conductive materials. Next, the exemplary method of fabrication performs a removal process on the non-conductive layer to remove some of the one or more non-conductive materials to from one or more trenches. Thereafter, the exemplary method of fabrication performs a deposition process within the non-conductive layer to deposit the one or more magnetic or ferromagnetic materials within the one or more trenches to form the magnetic core or a portion thereof. In an exemplary embodiment, the non-conductive material patterned to the magnetic core can be formed between conductive layers and/or non-conductive layer to provide laminated core for the magnetic core to reduce eddy currents within the magnetic core.

At step 406, the exemplary method of fabrication forms a coupling element, such as the secondary winding 218 or the inductive sensing element 318 to provide some examples, within the semiconductor layer stack. The coupling element is formed within the first layer, the second layer, and/or the third layer of the semiconductor layer stack. The exemplary method of fabrication forms a first portion of the coupling element along with the one or more bottom conductors of step 402, a second portion of the coupling element along with the magnetic core of step 404 using the one or more conductive materials in place of the one or more magnetic or ferromagnetic materials, and a third portion of the coupling element along with one or more tops conductors of step 408.

The first portion, the second portion, and the third portion are physically and electrically connected to form the coupling element.

At step 408, the exemplary method of fabrication forms one or more top conductors, such as the one or more top conductors 210.1 through 210.$n$ or the one or more top conductors 310.1 through 310.$n$ to provide some examples, within a third layer of the semiconductor layer stack. In an exemplary embodiment, the third layer of the semiconductor layer stack represents a conductive layer. In this exemplary embodiment, the exemplary method of fabrication performs a deposition process within the conductive layer to deposit the one or more conductive materials within the conductive layer. The exemplary method of fabrication performs a patterning process on the one or more conductive materials within the conductive layer to shape the one or more conductive materials to form the one or more top conductors within the third layer of the semiconductor layer stack. In another exemplary embodiment, the third layer of the semiconductor layer stack represents a non-conductive layer. In this other exemplary embodiment, the exemplary method of fabrication performs a deposition process within the non-conductive layer to grow the one or more non-conductive materials. Next, the exemplary method of fabrication performs a removal process on the non-conductive layer to remove some of the one or more non-conductive materials from one or more trenches. Thereafter, the exemplary method of fabrication performs a deposition process within the non-conductive layer to deposit the one or more conductive materials within the one or more trenches to form the one or more top conductors within the third layer of the semiconductor layer stack. Optionally, the exemplary method of fabrication can physically and electrically connect the one or more top conductors to the one or more bottom conductors of step 402 using one or more vias. In a further exemplary embodiment, the one or more top conductors can be formed using bond wire or ball bond instead of the third layer of the semiconductor layer.

Third Exemplary Inductive Sensing Circuit

FIG. 5A and FIG. 5B illustrate a third exemplary inductive sensing circuit that can be implemented within the exemplary voltage regulator circuit of FIG. 1A according to an exemplary embodiment of the present disclosure. FIG. 5A and FIG. 5B illustrate a top view 502 and a front view 504, respectively, of an inductive sensing circuit. The inductive sensing circuit can represent an exemplary embodiment of the inductive sensing circuit 104. As such, the inductive sensing circuit monitors the output voltage 152 to provide the sensed output voltage 156.

As additionally illustrated in FIG. 5A and FIG. 5B, one or more first conductors 510.1 through 510.$n$ and one or more second conductors 512.1 through 512.$n$ are situated within a layer 522 of the semiconductor layer stack. As illustrated in the top view 502 of FIG. 5A, the one or more first conductors 510.1 through 510.$n$ and the one or more second conductors 512.1 through 512.$n$ carry time varying currents, such as the output voltage 152 of the voltage regulator circuit 100 to provide an example. The time varying current carried by the one or more first conductors 510.1 through 510.$n$ flows in a direction that is opposite to a direction that the time varying current carried by the one or more second conductors 512.1 through 512.$n$ is flowing. As such, the time varying current carried by the one or more first conductors 510.1 through 510.$n$ is approximately 180 degrees out of phase with the time varying current carried by the one or more second conductors 512.1 through 512.$n$. For example, the one or more first conductors 510.1 through 510.$n$ can carry the output voltage 152 to a load attached to the voltage regulator circuit 100 and the one or more second conductors 512.1 through 512.$n$ can be configured to provide a return path for the output voltage 152 from the load. In an exemplary embodiment, the one or more first conductors 510.1 through 510.$n$ and the one or more second conductors 512.1 through 512.$n$ include a single first conductor and a single second conductor. However, one or more physical characteristics, such as line width or line thickness to provide some examples, of a single first conductor from among the one or more first conductors 510.1 through 510.$n$ and a single second conductor from among the one or more second conductors 512.1 through 512.$n$ can prevent the single first conductor and the single second conductor from carrying the time varying currents. In another exemplary embodiment, the one or more first conductors 510.1 through 510.$n$ and the one or more second conductors 512.1 through 512.$n$ include multiple first conductors and multiple second conductors to separate the time varying currents into multiple time varying currents.

The time varying currents carried by one or more first conductors 510.1 through 510.$n$ and the one or more second conductors 512.1 through 512.$n$ generate a magnetic field. Because, the time varying current carried by the one or more first conductors 510.1 through 510.$n$ is approximately 180 degrees out of phase with the time varying current carried by the one or more second conductors 512.1 through 512.$n$, both of these time varying currents contribute to the magnetic field. As further illustrated in FIG. 5A and FIG. 5B, an inductive sensing element, such as a spiral inductor 518, is situated within the layer 522 of the semiconductor layer stack. The magnetic field generated by the time varying currents induces a voltage, such as sensed output voltage 156 of the voltage regulator circuit 100 to provide an example, within the inductive sensing element, such as across terminals 508.1 and 508.2 of the spiral inductor 518. The spiral inductor 518 is formed using a conductive material that emanates from the first terminal 508.1 and progresses farther away from the first terminal 508.1 as the conductive material revolves around the first terminal 508.1 to the second terminal 508.2. Although the spiral inductor 518 is illustrated as being rectangular in shape in FIG. 5A, this is for illustrative purposes only. Those of ordinary skill in the relevant art(s) will recognize the spiral inductor 518 assume other shapes, such as a regular geometric structure, such as a regular circle, a regular ellipse, a regular polygon, an irregular geometric structure such as an irregular polygon, or any combination thereof to provide some examples, without departing from the spirit and scope of the present disclosure.

As illustrated in the front view 504 of FIG. 5B, the one or more first conductors 510.1 through 510.$n$, the one or more second conductors 512.1 through 512.$n$, and the spiral inductor 518 are situated within the layer 522 of the semiconductor layer stack. The layer 522 of the semiconductor layer stack can represent a conductive layer and/or a non-conductive layer of the semiconductor layer stack. In an exemplary embodiment, the one or more first conductors 510.1 through 510.$n$ and the one or more second conductors 512.1 through 512.$n$ can be situated within different layers of the semiconductor layer stack. For example, the one or more first conductors 510.1 through 510.$n$ can be situated with a first conductive layer of the semiconductor layer stack and the second conductors 512.1 through 512.$n$ can be situated with a second conductive layer of the semiconductor layer stack. In another exemplary embodiment, the turns of the spiral inductor 518 can be situated within different layers of the semiconductor layer stack.

Exemplary Fabrication of the Third Exemplary Inductive Sensing Circuit

Figure 5:
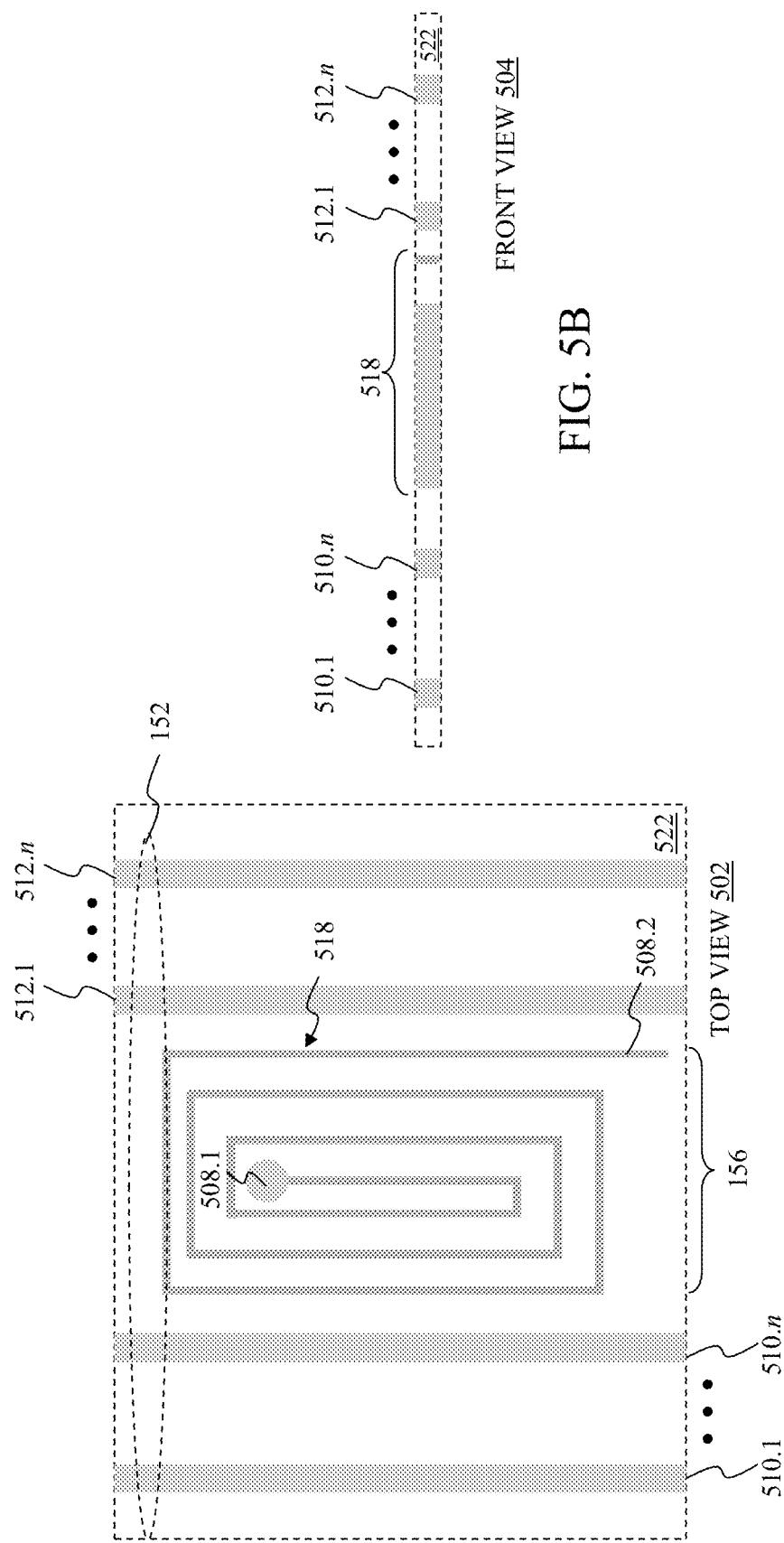
FIG. 5A and FIG. 5B illustrate of a third exemplary inductive sensing circuit that can be implemented within the exemplary voltage regulator circuit of FIG. 1A according to an exemplary embodiment of the present disclosure.
Figure 6:
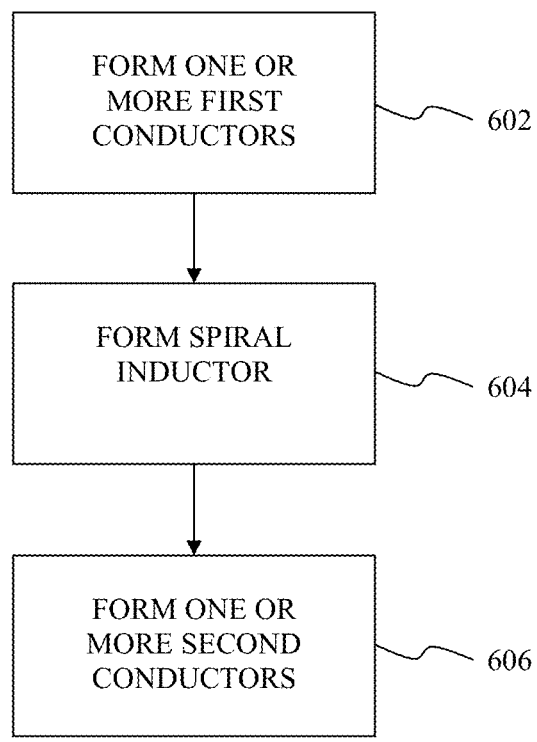
FIG. 6 illustrates an exemplary method of fabrication of the third exemplary inductive sensing circuit of FIG. 5 according to an exemplary embodiment of the present disclosure.

FIG. 6 illustrates an exemplary method of fabrication of the third exemplary inductive sensing circuit of FIG. 5 according to an exemplary embodiment of the present disclosure. The exemplary method of fabrication represents a multiple-step sequence of photolithographic and chemical processing steps to create an inductive sensing circuit, such as the inductive sensing circuit of FIG. 5 to provide an example. The multiple-step sequence of photolithographic and chemical processing steps can include deposition, removal, and/or patterning to provide some examples. The deposition represents a processing step of the exemplary method of fabrication where material is grown, coated, or otherwise transferred. The removal represents another processing step of the exemplary method of fabrication where material is removed. The patterning represents a further processing step exemplary method of fabrication where material is shaped or altered.

At step 602, the exemplary method of fabrication forms one or more first conductors, such as the one or more first conductors 510.1 through 510.*n* to provide an examples, within a conductive layer and/or non-conductive layer of a semiconductor layer stack. In an exemplary embodiment, the conductive layer and/or non-conductive layer of the semiconductor layer stack represents a conductive layer. In this exemplary embodiment, the exemplary method of fabrication performs a deposition process within the conductive layer to deposit one or more conductive materials within the conductive layer. The one or more conductive materials can include tungsten (W), aluminum (Al), copper (Cu), gold (Au), silver (Ag), or platinum (Pt) to provide some examples. The exemplary method of fabrication performs a patterning process on the one or more conductive materials within the conductive layer to shape the one or more conductive materials to form the one or more first conductors the conductive layer and/or non-conductive layer of the semiconductor layer stack. In another exemplary embodiment, the conductive layer and/or non-conductive layer of the semiconductor layer stack represents a non-conductive layer. In this other exemplary embodiment, the exemplary method of fabrication performs a deposition process within the non-conductive layer to grow one or more non-conductive materials. The one or more non-conductive materials can include silicon dioxide ($SiO_2$) or nitride ($N^{3-}$) to provide some examples. Next, the exemplary method of fabrication performs a removal process on the non-conductive layer to remove some of the one or more non-conductive materials to from one or more trenches. Thereafter, the exemplary method of fabrication performs a deposition process within the non-conductive layer to deposit the one or more conductive materials within the one or more trenches to form the one or more first conductors within the conductive layer and/or non-conductive layer of the semiconductor layer stack.

At step 604, the exemplary method of fabrication forms a spiral inductor, such as the spiral inductor 518 to provide an example, within the semiconductor layer stack. The spiral inductor is formed within the conductive layer and/or non-conductive layer of the semiconductor layer stack of step 602. The spiral inductor can be rectangular, a regular geometric structure, such as a regular circle, a regular ellipse, a regular polygon, an irregular geometric structure such as an irregular polygon, or any combination thereof to provide some examples. From the exemplary embodiment above, the conductive layer and/or non-conductive layer of the semiconductor layer stack of step 602 represents a conductive layer. In this exemplary embodiment, the exemplary method of fabrication performs a deposition process within the conductive layer to deposit one or more conductive materials within the conductive layer. The one or more conductive materials can include tungsten (W), aluminum (Al), copper (Cu), gold (Au), silver (Ag), or platinum (Pt) to provide some examples. The exemplary method of fabrication performs a patterning process on the one or more conductive materials within the conductive layer to shape the one or more conductive materials to form the spiral inductor within the conductive layer and/or non-conductive layer of the semiconductor layer stack of step 602. From the other exemplary embodiment above, the conductive layer and/or non-conductive layer of the semiconductor layer stack of step 602 represents a non-conductive layer. In this other exemplary embodiment, the exemplary method of fabrication performs a deposition process within the non-conductive layer to grow one or more non-conductive materials. The one or more non-conductive materials can include silicon dioxide ($SiO_2$) or nitride ($N^{3-}$) to provide some examples. Next, the exemplary method of fabrication performs a removal process on the non-conductive layer to remove some of the one or more non-conductive materials to from one or more trenches. Thereafter, the exemplary method of fabrication performs a deposition process within the non-conductive layer to deposit the one or more conductive materials within the one or more trenches to form the spiral inductor within the conductive layer and/or non-conductive layer of the semiconductor layer stack of step 602.

At step 606, the exemplary method of fabrication forms one or more second conductors, such as the one or more second conductors 512.1 through 512.*n* to provide an example, within the semiconductor layer stack. The one or more second conductors are formed within the conductive layer and/or non-conductive layer of the semiconductor layer stack of step 602. From the exemplary embodiment above, the conductive layer and/or non-conductive layer of the semiconductor layer stack of step 602 represents a conductive layer. In this exemplary embodiment, the exemplary method of fabrication performs a deposition process within the conductive layer to deposit one or more conductive materials within the conductive layer. The one or more conductive materials can include tungsten (W), aluminum (Al), copper (Cu), gold (Au), silver (Ag), or platinum (Pt) to provide some examples. The exemplary method of fabrication performs a patterning process on the one or more conductive materials within the conductive layer to shape the one or more conductive materials to form the one or more second conductors within the conductive layer and/or non-conductive layer of the semiconductor layer stack of step 602. From the other exemplary embodiment above, the conductive layer and/or non-conductive layer of the semiconductor layer stack of step 602 represents a non-conductive layer. In this other exemplary embodiment, the exemplary method of fabrication performs a deposition process within the non-conductive layer to grow one or more non-conductive materials. The one or more non-conductive materials can include silicon dioxide ($SiO_2$) or nitride ($N^{3-}$) to provide some examples. Next, the exemplary method of fabrication performs a removal process on the non-conductive layer to remove some of the one or more non-conductive materials to from one or more trenches. Thereafter, the exemplary method of fabrication performs a deposition process within the non-conductive layer to deposit the one or more conductive materials within the one or more trenches to form the one or more second conductors within the conductive layer and/or non-conductive layer of the semiconductor layer stack of step 602.

The foregoing Detailed Description discloses an integrated transformer. The integrated transformer includes a magnetic core situated in a first layer from among multiple layers of a semiconductor layer stack, a first conductor and a second conductor from among multiple conductors, and a via. The first conductor is situated within a second layer, above the first layer, from among the multiple layers of the semiconductor layer stack. The second conductor is situated within a third layer, below the first layer, from among the multiple layers of the semiconductor layer stack. The via physically and electrically connects the first conductor and the second conductor. The via, the first conductor, and the second conductor form a primary winding of the integrated transformer. The integrated transformer additionally includes a secondary winding, wrapped around the magnetic core, situated in the first layer, the second layer, and the third layer The integrated transformer can be fabricated by forming a first conductor within a first layer of a semiconductor layer stack, a magnetic core within a second layer of the semiconductor stack, and a second conductor within a third layer of the semiconductor stack. The first conductor and the second conductor form a primary winding of the integrated transformer. A coupling element is formed to wrap around the magnetic core to form a secondary winding of the integrated transformer.

The integrated transformer can be implemented within a voltage regulator circuit. The voltage regulator circuit includes a control element, an inductive sensing circuit, and an error detector. The control element adjusts an input voltage in accordance with an error signal to maintain a substantially constant output voltage. The inductive sensing circuit includes an integrated transformer and monitors the substantially constant output voltage to provide a sensed output voltage. The integrated transformer includes a magnetic core, multiple conductors that form a primary winding of the integrated transformer, and a secondary winding of the integrated transformer wrapped around the magnetic core. A first group of conductors from among the multiple conductors is situated above the magnetic core and a second group of conductors from among the multiple conductors is situated below the magnetic core. The error detector compares the sensed output voltage and a reference voltage to provide the error signal.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first plurality of conductors within a first layer of a semiconductor layer stack along a first horizontal direction, wherein the first plurality of conductors form a first portion of a primary winding of an integrated transformer to provide a primary path for a first electronic circuit;
    forming a magnetic core along a second horizontal direction that is orthogonal to the first direction within a second layer of the semiconductor layer stack that is beneath the first layer of the semiconductor layer stack, the forming of the magnetic core comprising:
        depositing one or more magnetic or ferromagnetic materials over the first plurality of conductors; and
        patterning the one or more magnetic or ferromagnetic materials to form the magnetic core orthogonal to the first plurality of conductors;
    forming a second plurality of conductors along the first horizontal direction and parallel with the first plurality of conductors within a third layer of the semiconductor layer stack that is beneath the second layer of the semiconductor layer stack to form a second portion of the primary winding to provide a return path for the first electronic circuit, the second plurality of conductors being formed within the third layer of the semiconductor layer stack to be orthogonal to the magnetic core and to be laterally displaced from the plurality of first conductors such that the plurality of first conductors and the plurality of second conductors do not overlap each other in a vertical direction passing through the magnetic core; and
    forming a coupling element within the first layer, the second layer, and the third layer of the semiconductor layer stack to wrap around the magnetic core to form a secondary winding of the integrated transformer, the coupling element including a first connection within the first layer of the semiconductor layer stack and a second connection within the second layer of the semiconductor layer stack to electrically connect the secondary winding of the integrated transformer to a second electronic circuit.

2. The method of claim 1, wherein the forming the first plurality of conductors comprises:
    depositing one or more conductive materials in a first dielectric layer; and
    patterning the one or more conductive materials to form the first plurality of conductors.

3. The method of claim 1, wherein the forming the first plurality of conductors comprises:
    growing one or more non-conductive materials;
    forming one or more trenches in the one or more non-conductive materials; and
    depositing one or more conductive materials within the one or more trenches to form the first plurality of conductors.

4. The method of claim 1, wherein a portion of the coupling element is parallel with the first plurality of conductors within the first layer of the semiconductor layer stack or the second plurality of conductors within the third layer of the semiconductor layer stack.

5. The method of claim 1, wherein the forming the magnetic core further comprises:
    growing one or more non-conductive materials on the one or more magnetic or ferromagnetic materials;
    forming one or more trenches in the one or more non-conductive materials; and
    depositing one or more second magnetic or ferromagnetic materials within the one or more trenches.

6. The method of claim 5, wherein the first plurality of conductors are electrically connected to the second plurality of conductors.

7. The method of claim 5, wherein the forming the magnetic core further comprises:
growing the one or more non-conductive materials between the one or more magnetic or ferromagnetic materials and the one or more second magnetic or ferromagnetic materials to form a lamination for the magnetic core.

8. The method of claim 1, wherein the forming the second plurality of conductors comprises forming the second plurality of conductors to be laterally displaced from the plurality of first conductors such that the plurality of first conductors and the plurality of second conductors do not overlap each other.

9. The method of claim 1, wherein the forming the magnetic core further comprises:
depositing a conductive layer;
forming one or more trenches in the conductive layer; and
depositing the one or more magnetic or ferromagnetic materials in the one or more trenches.

10. The method of claim 1, wherein the magnetic core comprises a planar core extending in the second horizontal direction, wherein the first plurality of conductors, the second plurality of conductors, and the secondary winding are sequentially placed along the second horizontal direction to be laterally displaced from the plurality of first conductors such that the plurality of first conductors and the plurality of second conductors do not overlap each other in the vertical direction passing through the magnetic core.

11. A method for forming an integrated transformer within a semiconductor layer stack of a semiconductor substrate, the method comprising:
forming a plurality of bottom conductors along a first horizontal direction within a first layer of the semiconductor layer stack to form a first portion of a primary winding of the integrated transformer to provide a primary path for a first electronic circuit;
depositing and patterning one or more magnetic or ferromagnetic materials along a second horizontal direction, orthogonal to the first horizontal direction, within a second layer of the semiconductor layer stack that is over the plurality of bottom conductors to form a magnetic core of the integrated transformer that is orthogonal to the plurality of bottom conductors;
forming a plurality of top conductors along the first horizontal direction within a third layer of the semiconductor layer stack to form a second portion of the primary winding that is parallel with the first portion of the primary winding to provide a reverse path for the first electronic circuit, the plurality of top conductors being formed to be laterally displaced from the plurality of bottom conductors such that the plurality of top conductors and the plurality of bottom conductors do not overlap each other in a vertical direction passing through the magnetic core; and
forming a coupling element within the first layer, the second layer, and the third layer of the semiconductor layer stack to wrap around the magnetic core to form a secondary winding of the integrated transformer, the coupling element including a first connection within the first layer of the semiconductor layer stack and a second connection within the second layer of the semiconductor layer stack to electrically connect the secondary winding of the integrated transformer to a second electronic circuit.

12. The method of claim 11, wherein the forming the coupling element comprises:
forming a portion of the coupling element to be parallel with the plurality of bottom conductors within the first layer of the semiconductor layer stack or the plurality of top conductors within the third layer of the semiconductor layer stack.

13. The method of claim 11, wherein the depositing and patterning comprises:
growing one or more non-conductive materials on the one or more magnetic or ferromagnetic materials;
forming one or more trenches in the one or more non-conductive materials; and
depositing one or more second magnetic or ferromagnetic materials within the one or more trenches.

14. The method of claim 13, wherein the growing the one or more non-conductive materials comprises:
growing the one or more non-conductive materials between the one or more magnetic or ferromagnetic materials and the one or more second magnetic or ferromagnetic materials to form a lamination for the magnetic core.

15. The method of claim 11, wherein the depositing and patterning comprises:
depositing and patterning the one or more magnetic or ferromagnetic materials to form the magnetic core of the integrated transformer having planar core extending in the second horizontal direction.

16. A method for forming an integrated transformer, the method comprising:
forming a plurality of bottom conductors along a first horizontal direction within a first layer of a semiconductor layer stack to form a first portion of a primary winding of the integrated transformer to provide a primary path for a first electronic circuit;
depositing and patterning one or more magnetic or ferromagnetic materials that are over the plurality of bottom conductors within a second layer of the semiconductor layer stack that is beneath the first layer of the semiconductor layer stack to form a magnetic core of the integrated transformer along a second horizontal direction that is orthogonal to the first horizontal direction;
forming a plurality of top conductors along the first horizontal direction within a third layer of the semiconductor layer stack that is beneath the second layer of the semiconductor layer stack to form a second portion of the primary winding that is parallel with the first portion of the primary winding to provide a reverse path for a first electronic circuit, the plurality of top conductors being formed to be laterally displaced from the plurality of bottom conductors such that the plurality of top conductors and the plurality of bottom conductors do not overlap each other in a vertical direction passing through the magnetic core; and
forming a coupling element within the first layer, the second layer, and the third layer of the semiconductor layer stack to wrap around the magnetic core to form a secondary winding of the integrated transformer, the coupling element including a first connection within the first layer of the semiconductor layer stack and a second connection within the second layer of the semiconductor layer stack to electrically connect the secondary winding of the integrated transformer to a second electronic circuit.

17. The method of claim 16, wherein the forming the coupling element comprises:
forming a portion of the coupling element to be parallel with the plurality of bottom conductors within the first layer of a semiconductor layer stack or the plurality of top conductors within the third layer of a semiconductor layer stack.

18. The method of claim 16, wherein the depositing and patterning comprises:
   growing one or more non-conductive materials on the one or more magnetic or ferromagnetic materials;
   forming one or more trenches in the one or more non-conductive materials; and
   depositing one or more second magnetic or ferromagnetic materials within the one or more trenches.

19. The method of claim 18, wherein the growing the one or more non-conductive materials comprises:
   growing the one or more non-conductive materials between the one or more magnetic or ferromagnetic materials and the one or more second magnetic or ferromagnetic materials to form a lamination for the magnetic core.

20. The method of claim 16, wherein the depositing and patterning comprises:
   depositing and patterning the one or more magnetic or ferromagnetic materials to form the magnetic core of the integrated transformer having a planar core extending in the second horizontal direction.

* * * * *